United States Patent
Yoon et al.

(10) Patent No.: US 7,595,253 B2
(45) Date of Patent: Sep. 29, 2009

(54) METHOD OF FORMING THE SEMICONDUCTOR DEVICE

(75) Inventors: Il-Young Yoon, Hwaseong-si (KR); Hong-Jae Shin, Seoul (KR); Nae-In Lee, Seoul (KR); Jae-Ouk Choo, Yongin-si (KR); Ja-Eung Koo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 41 days.

(21) Appl. No.: 11/797,827

(22) Filed: May 8, 2007

(65) Prior Publication Data
US 2007/0262393 A1    Nov. 15, 2007

(30) Foreign Application Priority Data
May 9, 2006    (KR)    ............... 10-2006-0041534

(51) Int. Cl.
*H01L 21/76*    (2006.01)
(52) U.S. Cl. ............... 438/424; 438/294; 438/295; 438/296; 438/318; 438/353; 438/355; 438/359
(58) Field of Classification Search ............... None
See application file for complete search history.

(56) References Cited
U.S. PATENT DOCUMENTS
5,960,297 A    9/1999    Saki
5,994,756 A    11/1999    Umezawa et al.
6,146,970 A *    11/2000    Witek et al. ............... 438/424
6,251,747 B1 *    6/2001    Zheng et al. ............... 438/424
6,593,206 B2 *    7/2003    Dickerson et al. ............... 438/424

FOREIGN PATENT DOCUMENTS

| KR | 10-0246874 | 3/2000 |
|---|---|---|
| KR | 1020030060144 A | 7/2003 |
| KR | 10-2004-0103557 | 12/2004 |
| KR | 1020050002382 A | 1/2005 |
| KR | 1020050020238 A | 3/2005 |
| KR | 10-2005-0031297 | 4/2005 |
| KR | 10-2005-0118509 | 12/2005 |

* cited by examiner

*Primary Examiner*—Zandra Smith
*Assistant Examiner*—Khanh B Duong
(74) *Attorney, Agent, or Firm*—Harness, Dickey & Pierce, P.L.C.

(57) ABSTRACT

Example embodiments provide a semiconductor device and a method of forming the same. According to the method, a capping insulation pattern may be formed to cover the top surface of a filling insulation pattern in a trench. The capping insulation pattern may have an etch selectivity according to the filling insulation pattern. As a result, the likelihood that the filling insulation layer may be etched by various cleaning processes and the process removing the buffer insulation pattern may be reduced or prevented.

11 Claims, 8 Drawing Sheets

Fig. 1

(CONVENTIONAL ART)

Fig. 2

(CONVENTIONAL ART)

Fig. 3

(CONVENTIONAL ART)

Fig. 4

(CONVENTIONAL ART)

METHOD OF FORMING THE SEMICONDUCTOR DEVICE

PRIORITY STATEMENT

This application claims priority under 35 USC § 119 to Korean Patent Application No. 2006-41534, filed on May 9, 2006, in the Korean Intellectual Property Office (KIPO), the entire contents of which are herein incorporated by reference.

BACKGROUND

1. Field

Example embodiments are related to a semiconductor device including a trench-type device isolation structure and method of forming the same.

2. Description of Related Art

A device isolation structure used in semiconductor devices electrically isolate unit devices (e.g., field effect transistor (FET), well, memory cells, and/or etc.) located adjacent to each other. Because semiconductor devices are becoming more highly integrated, device isolating technology providing quality insulation within a smaller area is being developed.

A widely used device isolation structure is a trench-type device isolation structure. A trench-type device isolation structure may be realized by forming a trench in a predetermined depth on a semiconductor substrate and then filling the trench with insulation material. A well-known method of forming a trench-type device isolation structure is explained below with reference to FIGS. 1-4.

FIG. 1 to FIG. 4 illustrate cross-sectional views used to describe a method of forming a conventional semiconductor device. In the figures, reference number "30" refers to a first region where density of patterns is high, and reference number "35" refers to a second region where density of patterns is low.

Figure 1:
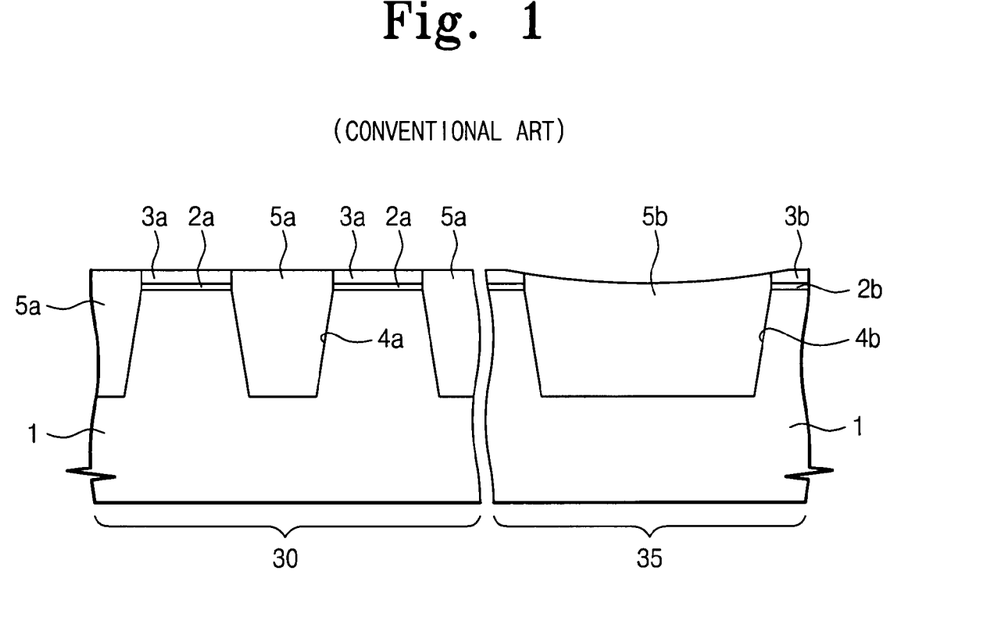
FIG. 1 to FIG. 4 illustrate cross-sectional views used to describe a conventional method of forming a semiconductor device.

Referring to FIG. 1, a buffer oxide and a hard mask layer (not shown) may be formed sequentially on a semiconductor substrate 1. The hard mask layer, buffer oxide, and the semiconductor substrate 1 are successively etched to form a first and a second trench 4a and 4b. The first trench 4a is formed in the first region 30 to define a first active region, and the second trench 4b is formed in the second region 35 to define a second active region. The width of the second trench 4b is wider than the width of the first trench 4a. Sequentially stacked first buffer oxide pattern 2a and first hard mask pattern 3a are formed on the first active region. Sequentially stacked second buffer oxide pattern 2b and second hard mask pattern 3b are formed on the second active region.

A filling oxide layer (not shown) is formed over the entire surface of the semiconductor substrate 1 to fill the first and second trenches 4a and 4b. The filling oxide layer is planarized until the first and second hard mask patterns 3a and 3b are exposed. Then, first and second filling oxide patterns 5a and 5b are formed to fill the first and second trenches 4a and 4b, respectively.

The method of forming the filling oxide layer with a high-density plasma oxide is widely known. A high-density plasma oxide is formed by repeatedly depositing and etching the oxide layer using a high density plasma. The method of planarizing the filling oxide layer using a chemical mechanical polishing process (hereinafter CMP process) is also widely known. The chemical mechanical polishing process may use a slurry in a solution state including a polishing agent and a pH control agent. The CMP process provides the slurry between a polishing pad and the semiconductor substrate 1 having the filling oxide layer and polishes by contacting the semiconductor substrate 1 and the polishing pad. When the filling oxide layer is polished by the CMP process, a dishing effect may occur in the second filling oxide layer which fills the second trench 4b having a large width. The center of the second filling oxide pattern 5b may be formed lower than the fringe area by the dishing effect.

Figure 2:
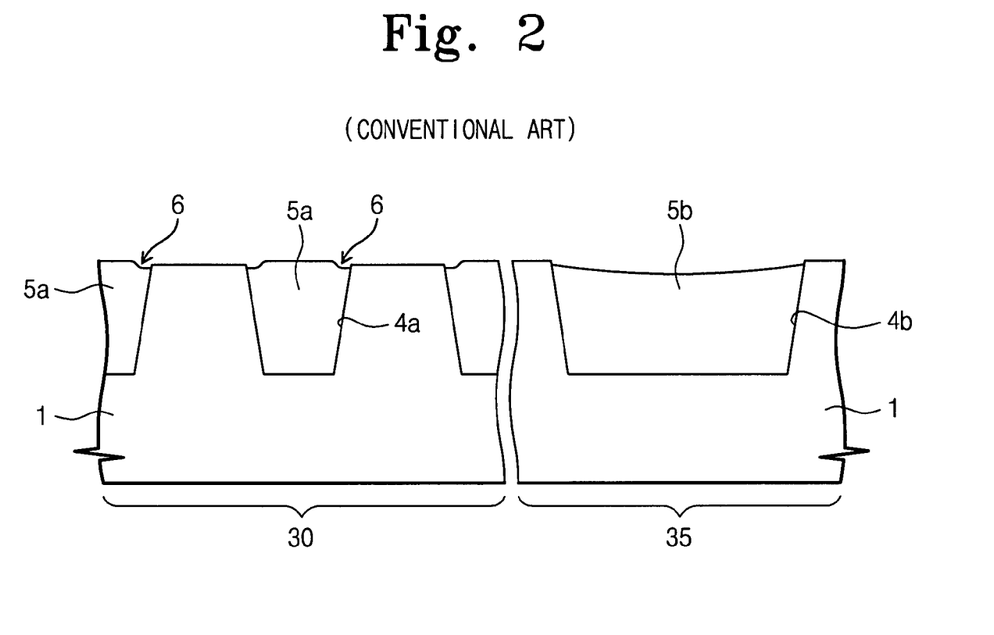

Referring to FIG. 2, the first and second active regions are exposed by removing the first and second hard mask patterns 3a and 3b and first and second buffer oxide patterns 2a and 2b. The first and second buffer oxide patterns 2a and 2b may be removed by wet etching in order to prevent plasma damage of exposed surfaces of the first and second active regions. At this time, the first and second filling oxide patterns 5a and 5b, which are made of oxide, are also etched. An area along the edge of the top surface of the densely patterned first filling oxide pattern 5a near the first active region may be etched further to form a dent 6.

Figure 3:
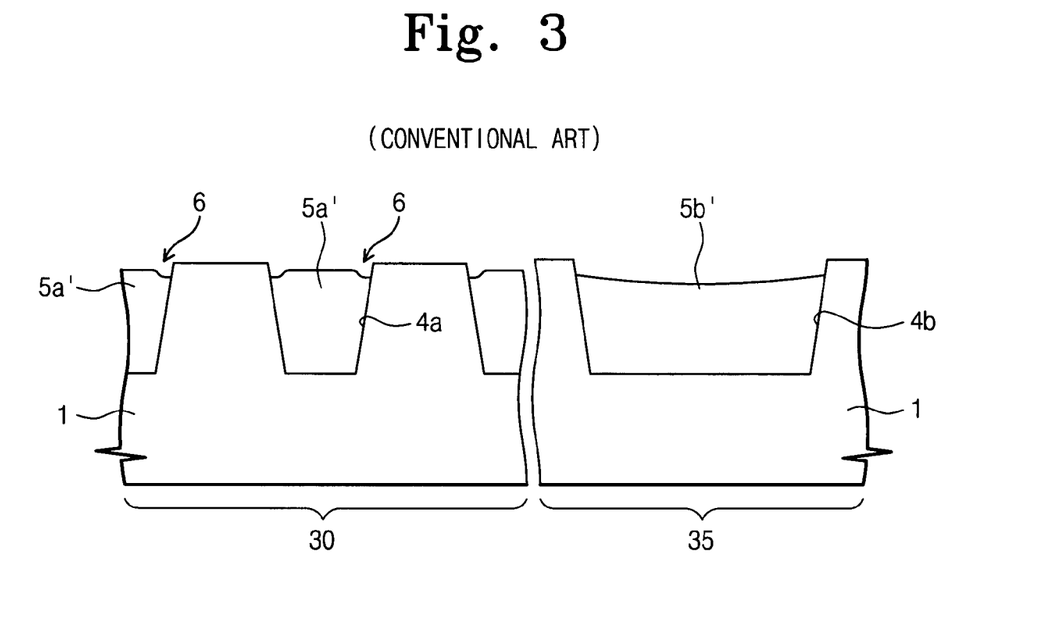

Referring to FIG. 3, after the first and second active regions are exposed, various processes may be performed. For example, an ion injection process to form a well, an ion injection process to adjust threshold voltage of an electric field effect transistor, and a cleaning process before forming a gate oxide layer may be performed. Before performing the ion injection processes, an ion injection buffer oxide layer may be formed to minimize damage of the exposed active region. The ion injection buffer oxide layer may be removed by certain processes including, for example, a cleaning process, after performing the ion injection processes. The cleaning process before forming the gate oxide layer may remove the natural oxide layer formed in an exposed active region. The first and second filling oxide patterns 5a and 5b may be further etched by various forms of cleaning processes before forming the gate oxide layer. As a result, top surfaces of the first and second filling oxide patterns 5a' and 5b' further etched by cleaning processes are formed lower than the surfaces of the active regions. Therefore, the planarization of the semiconductor substrate may be defective.

Figure 4:
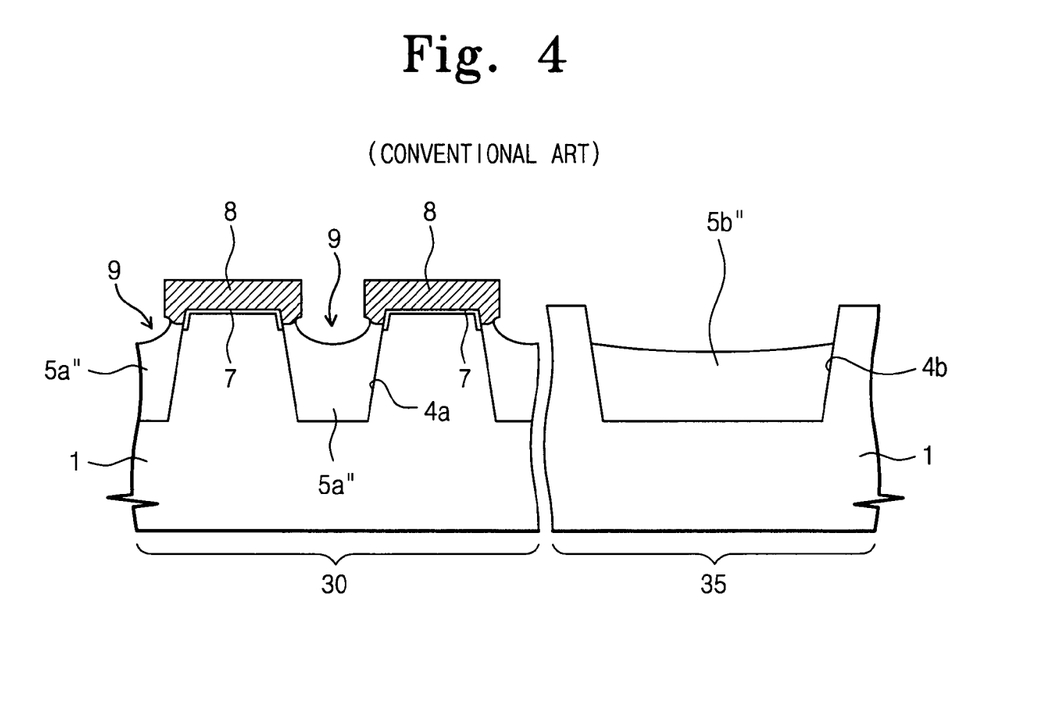

Referring to FIG. 4, a gate oxide layer 7 is formed in the active regions and a gate conductive layer (not shown) is formed in the semiconductor substrate 1. The gate conductive layer is patterned to form a gate electrode 8 over the first active region. The gate electrode 8 covers the sidewall along the edge of the first active region. Therefore, the hump effect may occur at a transistor having the gate electrode 8 and the characteristics of leakage current within the transistor may be deteriorated.

Impurity ions are injected using the gate electrode 8 as a mask to form source and drain regions (not shown) in the first active region on both sides of the gate electrode 8. A metal silicide may be formed on the surface of the source and drain regions.

Various cleaning processes may be performed after the gate electrode 8 is formed. For example, after the source and drain regions are formed, a cleaning process to remove the surface damage of the first active region on both sides of the gate electrode 8 and/or a cleaning process performed after forming the metal silicide may be performed. Because the cleaning processes are performed after forming the gate electrode 8, the first filling oxide pattern 5a" and the second filling oxide pattern 5b" exposed between the gate electrode 8 may be further etched. Top surfaces of the first and second filling oxide patterns 5a" and 5b" are further etched by the cleaning processes after the gate electrode 8 is formed. The top surfaces first and second filling oxide patterns 5a" and 5b" may be formed lower than the top surfaces of the active regions. An indented region 9 may be formed in the first filling oxide pattern 5a" between the gate electrodes 8.

According to the above conventional method of forming a semiconductor device, a high density plasma oxide layer is used as the filling oxide layer. Because semiconductor devices are becoming more highly integrated, the gap fill characteristics are reaching a limit due to the high density plasma oxide layer. As a result, a void may occur in the first filling oxide pattern 5a and may decrease reliability of the semiconductor device. For these reasons, new material having better gap fill characteristics are being researched.

The first and second filling oxide patterns 5a and 5b are etched by cleaning processes before forming the gate oxide layer 7. This may cause the dent 6 to be formed or cause the top surfaces of the first and second filling oxide patterns 5a' and 5b' to be formed lower than the top surfaces of the active regions. Therefore, the hump effect may occur in the electric field effect transistor.

The first and second filling oxide patterns 5a' and 5b' may be further etched by cleaning processes after forming the gate electrode 8 to form an indented region 9 between the gate electrodes 8. Subsequently, formed interlayer oxide layer may not fill the indented region 9 sufficiently because the indented region 9 has a higher aspect ratio. Therefore, a void may occur in the indented region 9 and may decrease reliability of the semiconductor device. Further, if the indented region 9 is filled with a metal layer, a bridge may occur among the unit devices and may cause a defect in the semiconductor device.

SUMMARY

Example embodiments are directed to a semiconductor device and a method of forming the same.

According to example embodiments, a semiconductor device may comprise an active region defined by a trench formed in a semiconductor substrate, a filling insulation pattern in the trench, a liner between the filling insulation pattern and the sidewall and bottom surface of the trench, and a capping insulation pattern on the top surface of the filling insulation pattern. The liner may have an etch selectivity according to the filling insulation pattern. The capping insulation pattern may include an insulation material having an etch selectivity according to the filling insulation pattern. In addition, the capping insulation pattern may be in contact with the uppermost portion of the liner interposed between the filling insulation pattern and the sidewall of the trench, and the filling insulation pattern may be surrounded by the capping insulation pattern and the liner.

According to example embodiments, a method of forming a semiconductor device may comprise patterning a buffer insulation layer and a hard mask layer successively stacked on a substrate to form an opening exposing the substrate, etching the exposed substrate to form a trench defining an active region, forming a filling insulation pattern to fill the trench, forming conformally a capping insulation layer having an etch selectivity according to the filling insulation pattern on the surface of the substrate, forming a sacrificial insulation pattern on the capping insulation layer on the filling insulation pattern. The sacrificial insulation pattern may fill the opening and may have an etch selectivity according to the capping insulating layer. The method of forming a semiconductor device may further comprise etching the capping insulation layer and the patterned hard mask layer to expose sidewalls of the sacrificial insulation pattern and the patterned buffer insulating layer and to form a capping insulation pattern below the sacrificial insulation pattern, and etching the patterned buffer insulating layer to expose the active region.

BRIEF DESCRIPTION OF THE DRAWINGS

Example embodiments will be more clearly understood from the following detailed description taken in conjunction with the accompanying drawings. FIGS. 1-15 represent non-limiting, example embodiments as described herein.

DETAILED DESCRIPTION OF EXAMPLE EMBODIMENTS

Reference will now be made in detail to example embodiments, examples of which are illustrated in the accompanying drawings. However, example embodiments are not limited to the embodiments illustrated hereinafter, and the embodiments herein are rather introduced to provide easy and complete understanding of the scope and spirit of example embodiments. In the drawings, the thicknesses of layers and regions are exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 5 to FIG. 12 illustrate cross-sectional views used to describe a method of forming a semiconductor device according to example embodiments. FIG. 13 illustrates a cross-sectional view of a portion of a polishing apparatus to describe the CMP process included in the method of forming a semiconductor device according to example embodiments.

Figure 5:
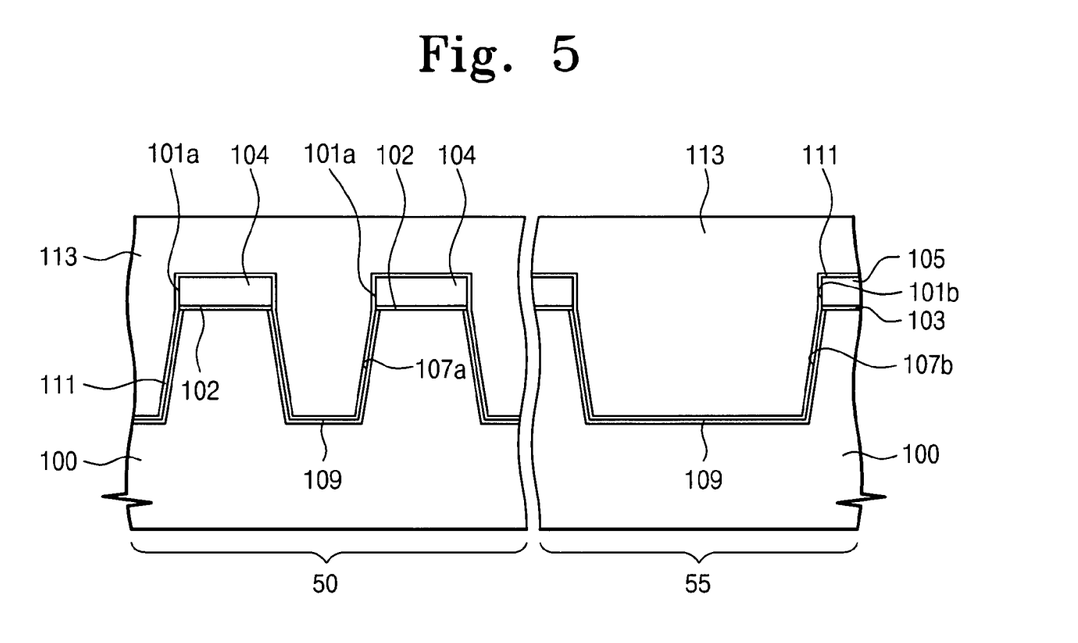
FIG. 5 to FIG. 12 illustrate cross-sectional views used to describe a method of forming a semiconductor device according to example embodiments.

Referring to FIG. 5, reference number "50" illustrates a first region 50 with a higher density of patterns and reference number "55" illustrates a second region 55 with a lower density of patterns. The first and second regions 50 and 55 may correspond to a cell region including memory cells and a peripheral circuit region, respectively. The first and second regions 50 and 55 may also correspond to a region where finer patterns may be formed in a higher density area, and a region where patterns having larger line widths may be formed in a lower density area, respectively.

A buffer insulating layer and a hard mask layer (not shown) may be sequentially formed on a semiconductor substrate 100. The hard mask layer and the buffer insulating layer may be patterned successively to form first and second openings 101a and 101b exposing the semiconductor substrate 100. The first and second openings 101a and 101b may be formed in the first and second regions 50 and 55, respectively. In the first region 50, a first buffer insulation pattern 102 and a first hard mask pattern 104 may be formed successively stacked. In the second region 55, a second buffer insulation pattern 103 and a second hard mask pattern 105 may be formed successively stacked. The first buffer insulation pattern 102 and the first hard mask pattern 104 constitute the sidewall of the first opening 101a, and the second buffer insulation pattern 103 and the second hard mask pattern 105 constitute the sidewall of the second opening 101b. The width of the first opening 101a may be smaller than the width of the second opening 101b. The width of the first opening 101a may be the minimum line width of the semiconductor device.

The first and second hard mask patterns 104 and 105 may include a material having an etch selectivity according to the semiconductor substrate 100. For example, the first and second hard mask patterns 104 and 105 may include nitride or oxy-nitride. The first and second buffer insulation patterns 102 and 103 may include a material capable of buffering stress from the first and second hard mask patterns 104 and 105. For example, the first and second buffer insulation patterns 102 and 103 may include oxide. In particular, the first buffer insulation pattern 102 may include thermal oxide.

The semiconductor substrate 100 exposed to the first and second openings 101a and 101b may be etched to form first and second trenches 107a and 107b which may define active regions. The first trench 107a may be formed in the first region 50 to define a first active region of the first region 50. The second trench 107b may be formed in the second region 55 to define a second active region of the second region 55. The width of the second trench 107b may be larger than the width of the first trench 107a due to the widths of the first and second openings 101a and 101b.

After forming the trenches 107a and 107b, the thermal oxidation process may be performed to the semiconductor substrate 100 to form a sidewall oxide layer 109 on the bottom surfaces and the sidewall of the trenches 107a and 107b. By forming the sidewall oxide layer 109, etch damage on the sidewalls and the bottom surfaces of the trenches 107a and 107b may be reduced.

A liner layer 111 may be formed conformally (e.g., formed of a sufficient equal thickness along the surface of the lower structure) on the surface of the semiconductor substrate 100. Therefore, the liner layer 111 may be formed of an equal thickness along the bottom surface of the first and second trenches 107a and 107b. Also, the liner layer 111 may be formed of an equal thickness along the sidewall of the first and second trenches 107a and 107b.

A filling insulating layer 113 may be formed on the liner layer 111 to fill the first and second trenches 107a and 107b and the first and second openings 101a and 101b. The liner layer 111 may include insulating material having an etch selectivity according to the filling insulating layer 113. The liner layer 111 may include nitride or oxy-nitride. The filling insulating layer 113 may include oxide. In particular, the filling insulating layer 113 may include HARP oxide formed by the High Aspect Ratio Process (HARP).

The HARP process may include an initial step of forming a nucleation layer with a lower surface sensitivity and a main deposition step of a higher deposition rate. The nucleation layer may be formed by adjusting the quantity of influx of the source (e.g., higher $O_3$-TEOS). The nucleation layer may be formed homogeneously (with higher aspect ratio) on the bottom surface and the sidewall. As a result, the HARP oxide layer may have higher performance gap fill characteristics. Also, the stress on the semiconductor substrate 100 by the HARP oxide layer may be lower in comparison to the stress on the semiconductor substrate 100 by the high-density plasma oxide layer. The HARP oxide layer may have a higher etch rate in comparison to the high-density plasma oxide layer. In addition, the filling insulating layer 113 may include a high-density plasma oxide layer. The filling insulating layer 113 may also include another oxide having higher performance gap fill characteristics.

Figure 6:
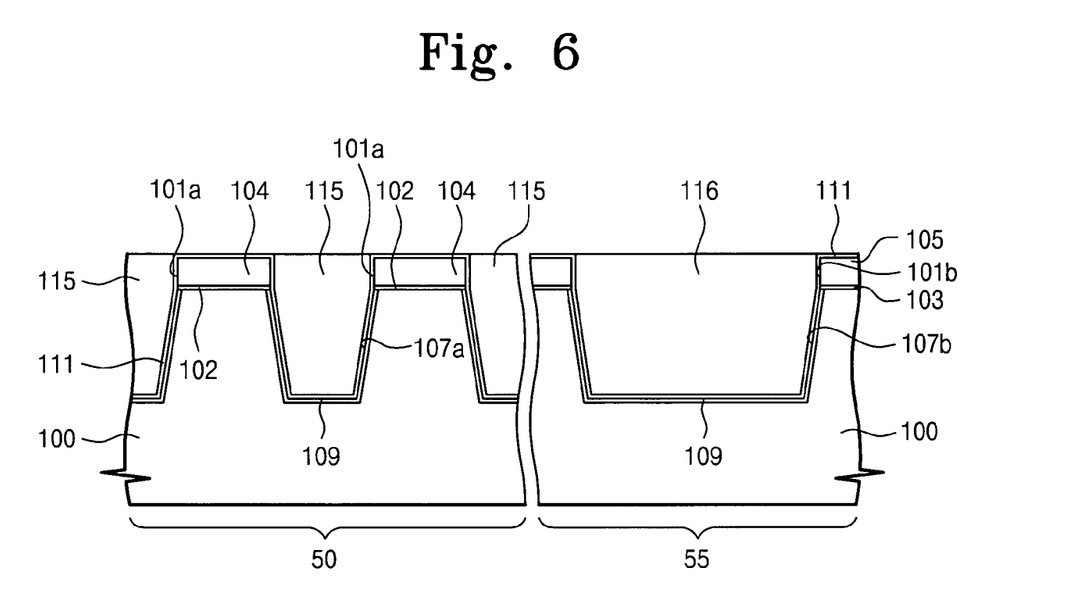

Referring to FIG. 6, the filling insulating layer 113 may be planarized until the liner layer 111 on the hard mask patterns 104 and 105 is exposed. A first planarized filling insulating layer 115 may be formed to fill the first trench 107a and the first opening 101a. A second planarized filling insulating layer 116 may be formed to fill the second trench 107b and the second opening 101b.

The process of planarizing the filling insulating layer 113 may be performed by a chemical-mechanical polishing (CMP) process. In particular, the filling insulating layer 113 may be planarized by an abrasive-fixed CMP process. The abrasive-fixed CMP process may be a CMP process using a polishing pad containing polishing agents. This will now be described below in reference to FIG. 13.

Referring to FIG. 13, a polishing apparatus may include a polishing table 200. A polishing pad 210 may be mounted on the polishing table 200. The polishing pad 210 may include a plurality of protrusions 215 protruding towards the semiconductor substrate 100. The protrusions 215 may be juxtaposed two-dimensionally and spaced apart from each other. Polishing agents 220 may be contained in the polishing pad 210. The polishing agents 220 may be distributed evenly in the polishing pad 210, the protrusions 215, and the polishing pad 210. The polishing agent 220 may be at least one selected from a group consisting of silica ($SiO_2$) and ceria ($CeO_2$).

Reference number "A" may be the polished surface of the semiconductor substrate 100. The filling insulating layer 133 of FIG. 5 may be formed on the polished surface A. During the planarizing process, the semiconductor substrate 100 may be rotated and a chemical solution 230 may be supplied between the polished surface A and the polishing pad 210. The chemical solution 230 may include a pH control agent and a surface active agent. However, the chemical solution 230 may not include a material in a particle form.

During the planarizing process, the polished surface A may contact the polishing pad 210 with the chemical solution 230 interposed in between. The polished surface A may contact the protrusions 215 containing the polishing agents 220. The semiconductor substrate 100 may rotate and at least one of the semiconductor substrate 100 and the polishing table 200 moves horizontally. Thus, the filling insulating layer 113 may be planarized.

In accordance with the abrasive-fixed CMP process, the polishing agents 220 may be fixed in the polishing pad 210. Thus, the polishing pad 210 may contact the liner layer 111 on the first and second hard mask patterns 104 and 105. The amount of polishing agents 220 etching the planarized filling insulating layers 115 and 116 in the first and second trenches 107a and 107b may be reduced or minimized. As a result, the likelihood that the conventional dishing effect may occur to the second planarized filling insulating layer 116 having the larger width may be reduced or minimized.

Figure 7:
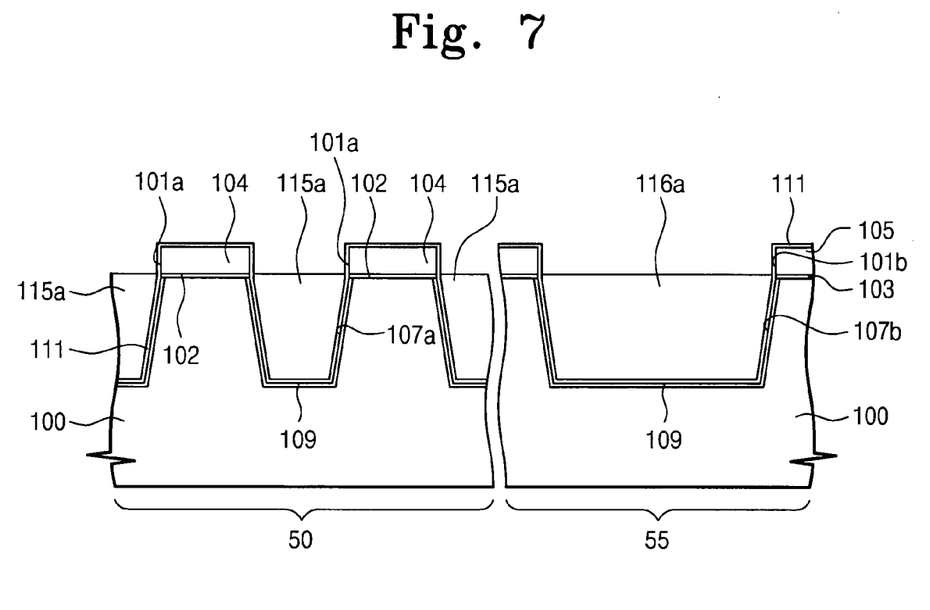

Referring to FIG. 7, an etch process may be performed to the top surfaces of the first and second planarized filling insulating layers 115 and 116. A first filling insulation pattern 115a filling the first trench 107a and a second filling insulation pattern 116a filling the second trench 107b may be formed. The top surface of the first filling insulation pattern 115a may be formed at the same level as the top surface of the first active region and the top surface of the second filling insulation pattern 116a may be formed at the same level as the top surface of the second active region.

The top surfaces of the first and second planarized filling insulating layers 115 and 116 may be etched by a wet etch process or a dry etch process. As the first and the second filling insulation patterns 115a and 116a are formed, the liner layer 111 formed on the sidewalls of the first and second hard mask patterns 104 and 105 may be exposed.

Figure 8:
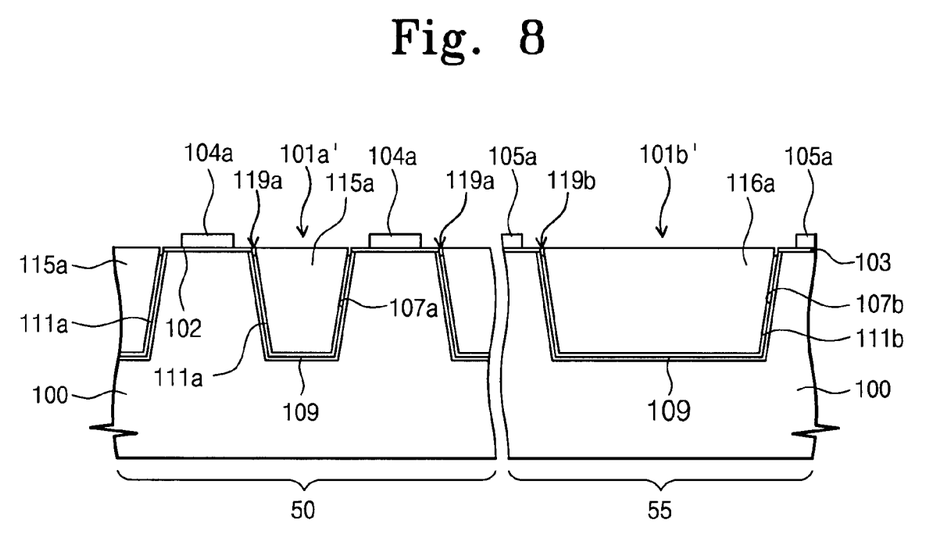

Referring to FIG. 8, the liner layer 111 and the first and second hard mask patterns 104 and 105 may be isotropically etched. Thus, the widths of the first and second openings 101a and 101b may be widened. The liner layer 111 and the first and second hard mask patterns 104 and 105 may include the same material. A first opening 101a' with a widened width may expose the first buffer insulation pattern 102 disposed on the edge of the first active region. Similarly, a second opening 101b' with a widened width may expose the second buffer insulation pattern 103 disposed on the edge of the second active region. The first and second liners 111a and 111b may be formed by an isotropic etching process. The first liner 111a may be interposed between the sidewall and the bottom surface of the first trench 107a and the first filling insulation pattern 115a. The second liner 111b may be interposed between the sidewall and the bottom surface of the second trench 107b and the second filling insulation pattern 116a. The first and second liners 111a and 111b may be disposed on the sidewall oxide layer 109. In the figures, reference numbers "104a" and "105a" refer to an isotropically etched first hard mask pattern 104a and an isotropically etched second hard mask pattern 105a, respectively.

By isotropically etching the liner layer 111, the top portion of the first liner 111a lined between the sidewall of the first trench 107a and the first filling insulation pattern 115a may be formed to be lower than the edge of the top surface of the first filling insulation pattern 115a. A first groove 119a may be formed on the top portion of the first liner 111a. The bottom surface of the first groove 119a may be the top portion of the first liner 111a, and both sidewalls of the first groove 119a may be constituted with the sidewall of the first trench 107a or the sidewall of the first filling insulation pattern 115a. Similarly, the top portion of the second liner 111b lined between the sidewall of the second trench 107b and the second filling insulation pattern 116a may be formed to be lower than the edge of the top surface of the second filling insulation pattern 116a. A second groove 119b may be formed on the top portion of the second liner 111b.

Figure 9:
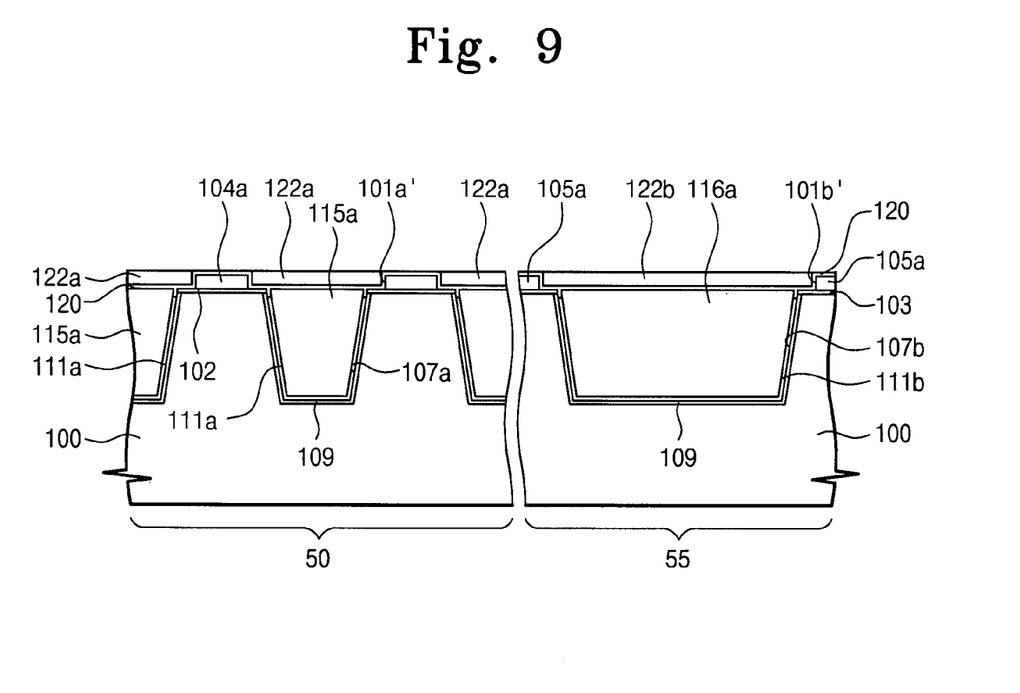

Referring to FIG. 9, a capping insulating layer 120 may be formed conformally over the surface of the semiconductor substrate 100. The capping insulating layer 120 may also be formed conformally along the inside walls and bottom surfaces of the first and second openings 101a' and 101b' having a widened width. The capping insulating layer 120 may fill the first and second grooves 119a and 119b and may contact the first and second liners 111a and 111b. The capping insulating layer 120 may include an insulating material having an etch selectivity according to the first and second filling insulation patterns 115a and 116a. The capping insulating layer 120 may also include the same material as the first and second liners 111a and 111b. For example, the capping insulating layer 120 may include nitride or oxy-nitride.

A sacrificial insulating layer (not shown) may be formed to fill the first and second openings 101a' and 101b' on the surface of the capping insulating layer 120. The sacrificial insulating layer may be planarized until the capping insulating layer 120 is exposed on the first and second hard mask patterns 104a and 105a. This may form a first sacrificial insulating pattern 122a which fills the first opening 101a' and a second sacrificial insulating pattern 122b which fills the second opening 101b'.

The process of planarizing the sacrificial insulating layer may be performed by the CMA process. In particular, the sacrificial insulating layer may be planarized by the abrasive-fixed CMP process. The abrasive-fixed CMP process may be performed in the same manner as described above in reference to FIG. 13. In other words, a polishing pad having a polishing agent equally contained and a chemical solution not including any particles may be used to planarize the sacrificial insulating layer by using the abrasive-fixed CMP process. As a result, the likelihood that the conventional dishing effect may occur at the second sacrificial insulating pattern 122b may be reduced or minimized.

The sacrificial insulating patterns 122a and 122b may include a material having an etch selectivity according to the capping insulating layer 120. For example, the sacrificial insulating patterns 122a and 122b may include an oxide (e.g., CVD oxide, high-density plasma oxide. HARP oxide, or etc.).

Figure 10:
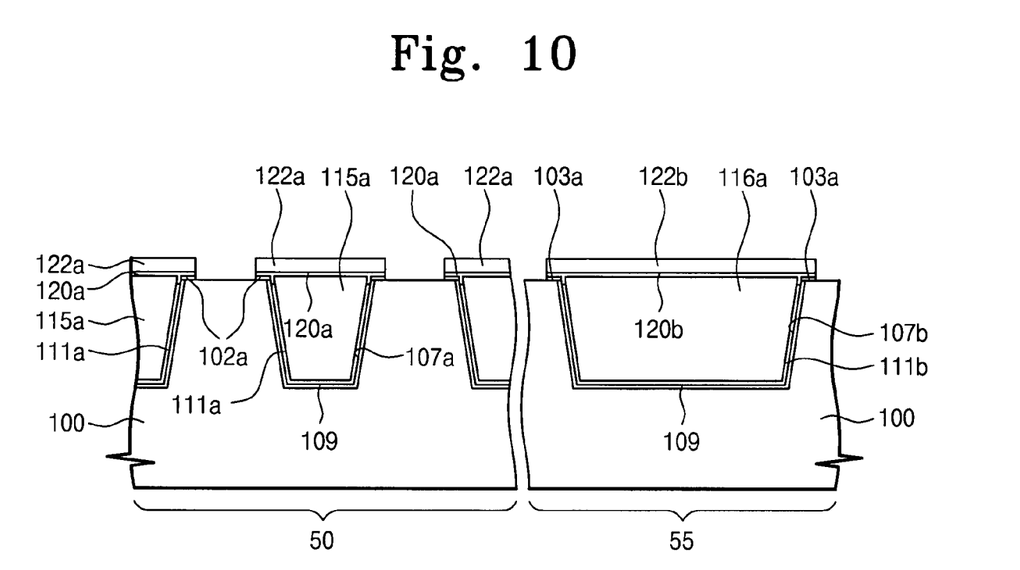

Referring to FIG. 10, the exposed capping insulating layer 120 and the first and second hard mask patterns 104a and 105a may be etched to expose the sidewalls of the buffer insulation patterns 102 and 103 and the sidewalls of the sacrificial insulating patterns 122a and 122b. As a result, a first capping insulation pattern 120a may be formed under the first sacrificial insulating pattern 122a, and a second capping insulation pattern 120b may be formed under the second sacrificial insulating pattern 122b. The first capping insulation pattern 120a may be in contact with the first liner 111a, and both may surround the first filling insulation pattern 115a. The first capping insulation pattern 120a may cover the edge of the first active region.

Similarly, the second capping insulation pattern 120b may contact the second liner 111b, and the second liner 111b may surround the second filling insulation pattern 116a. The second capping insulation pattern 120b may cover the edge of the second active region. The center portion of the top surface of the first capping insulation pattern 120b may be on the same or on a higher level than the top surface of the first active region. The center portion of the top surface of the second capping insulation pattern 120b may be on the same or on a higher level than the top surface of the second active region. The exposed capping insulating layer 120 and the first and second hard mask patterns 104a and 105a may be etched using isotropic etching or anisotropic etching.

Subsequently, the exposed first and second buffer insulation patterns 102 and 103 may be etched to expose the first and second active regions. A portion 102a of the first buffer insulation pattern 102 may remain between the first capping insulation pattern 120a and the edge of the first active region. This may be defined as the first relaxation insulation pattern 102a. A portion 103a of the second buffer insulation pattern 103 may remain between the second capping insulation pattern 120b and the edge of the second active region. This may be defined as the second relaxation insulation pattern 103a. The first and second buffer insulation patterns 102 and 103 may be etched using wet etching to expose the first and second active regions. When etching the first and second buffer insulation patterns 102 and 103, portions of the first and second sacrificial insulating patterns 122a and 122b may also be etched.

Figure 11:
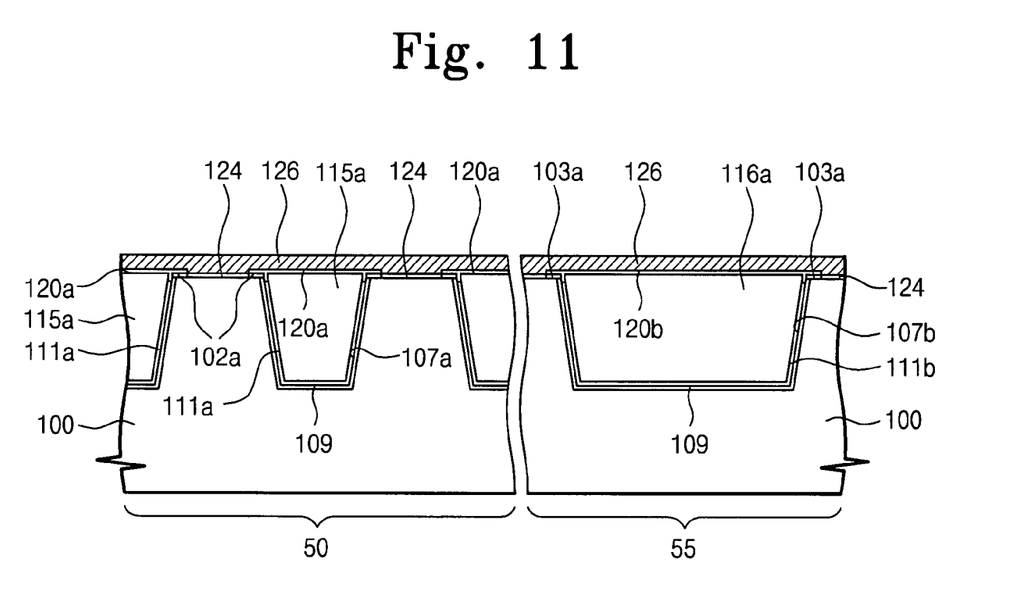

Referring to FIG. 11, before forming the gate insulating layer and after exposing the first and second active regions, at least one cleaning process may be performed to remove the first and second sacrificial insulation patterns 122a and 122b. As a result, the capping insulation patterns 120a and 120b may be exposed. Subsequently, a gate insulating layer 124 may be formed on the first and second active regions. A gate conductive layer 126 may then be formed on the surface of the semiconductor substrate 100.

At least one of the cleaning processes may include removing the natural oxide layer before the gate insulating layer 124 is formed. Also, post cleaning processes may be performed after performing various ion implantation processes. The first and second sacrificial insulating patterns 122a and 122b may be formed to a thickness removable by at least one of the cleaning processes. In addition, the amount of etching of the first and second sacrificial insulating patterns 122a and 122b, when etching the first and second buffer insulation patterns 102 and 103, should be considered in adjusting the thicknesses of the first and second sacrificial insulating patterns 122a and 122b. By adjusting the thicknesses of the first and second hard mask patterns 104a and 105a and/or the thickness of the capping insulating layer 120, the thicknesses of the first and second sacrificial insulating patterns 122a and 122b may be controlled.

The gate insulating layer 124 may include thermal oxide. The gate conductive layer 126 may include conductive material. For example, the gate conductive layer 126 may include at least one selected from the group consisting of doped polysilicon, metal (e.g., tungsten, molybdenum, etc.), conductive metal nitride (e.g., titanium nitride (TiN), tantalum nitride (TaN), etc.), and metal silicide (e.g., tungsten silicide, etc.).

Figure 12:
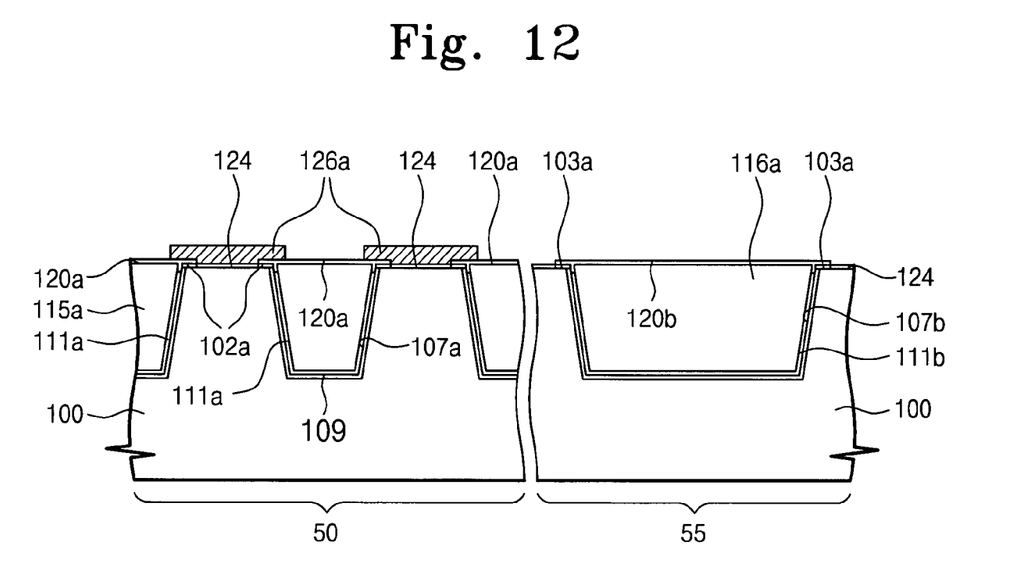
Figure 13:
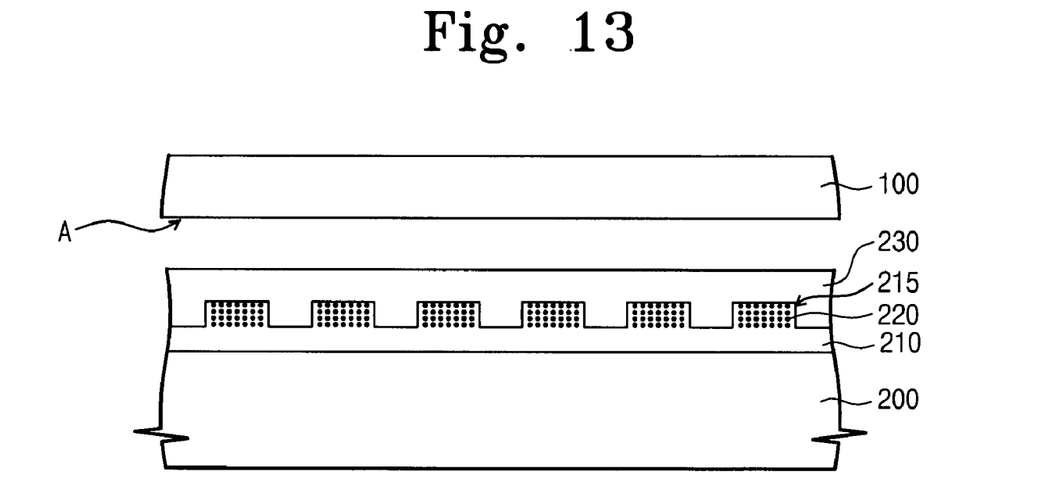
FIG. 13 illustrates a cross-sectional view of a portion of a polishing apparatus to describe a chemical mechanical polishing (CMP) method included in the method of forming a semiconductor device according to example embodiments.

Referring to FIG. 12, the gate conductive layer 126 may be patterned to form a gate electrode 126a over the first active region. Then, the gate conductive layer 126 formed in the second region 55 may be removed. Gate patterns formed in the second region may be in a form required for the second region 55.

Using the above described method of forming a semiconductor device, the first and second capping insulation patterns 120a and 120b may be formed before exposing the first and second active regions by etching the first and second buffer insulation patterns 102 and 103. The first and second filling insulation patterns 115a and 116a may be covered with the first and second capping insulation patterns 120a and 120b having etching selectivity. As a result, the likelihood that the filling insulation patterns 115a and 116a may be etched by at least one of the cleaning processes (e.g., an ion injection cleaning process and/or a cleaning process before forming the gate insulating layer 124) and the etching process of the first and second buffer insulation patterns 102 and 103 may be reduced or prevented. Thus, the likelihood of an occurrence of the conventional dent and further etching of the filling oxide pattern may be reduced or prevented.

The first and second filling insulation patterns 115a and 116a may be protected by the first and second capping insulation patterns 120a and 120b and by the first and second liners 111a and 111b. As such, the first and second filling insulation patterns 115a and 116a may be further protected from the cleaning process and the etching process of the first and second buffer insulation patterns 102 and 103.

The first and second sacrificial insulating patterns 122a and 122b may be formed on the first and second capping insulation patterns 120a and 120b. As such, the first and second capping insulation patterns 120a and 120b may be protected by the first and second sacrificial insulating patterns 122a and 122b while the cleaning processes are performed. Therefore, the first and second filling insulation patterns 115a and 116a may be further protected.

Because of the first and second capping insulation patterns 120a and 120b, the first and second filling insulation patterns 115a and 116a may be protected from the cleaning process performed between forming the gate electrodes 126a and forming an interlayer insulating layer (not shown). Therefore, the likelihood that the first conventional dented region may be formed at the filling insulation patterns 115a between the gate electrodes 126a may be reduced or prevented.

A semiconductor device according to example embodiments will now be described below with reference to FIGS. 14-15.

Figure 14:
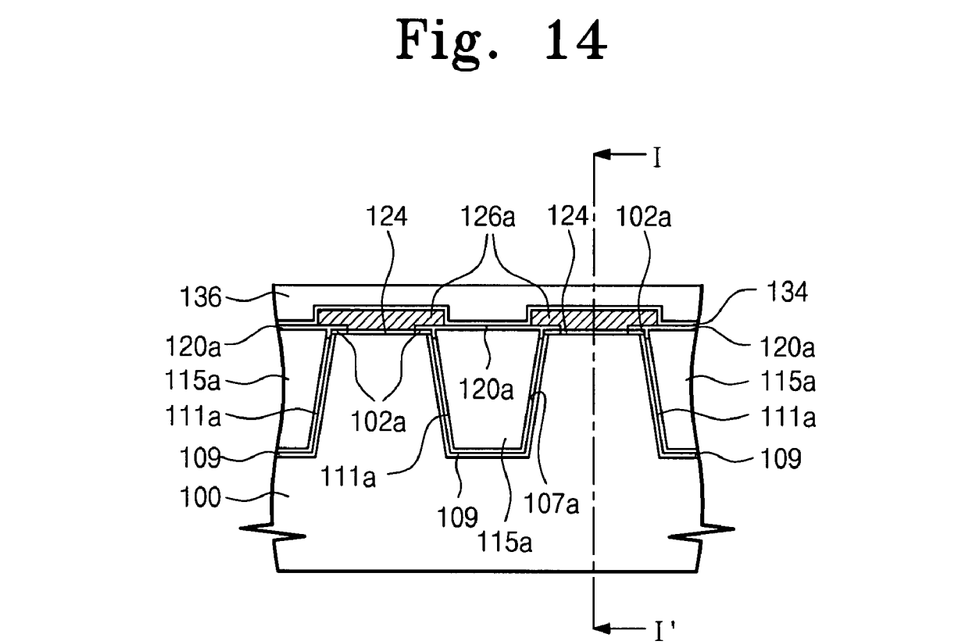
FIG. 14 illustrates a cross-sectional view of a semiconductor device according to example embodiments.

FIG. 14 is a cross-sectional view illustrating a semiconductor device according to example embodiments. FIG. 15 is a cross-sectional view of the cross section taken along I-I' of FIG. 14.

Figure 15:
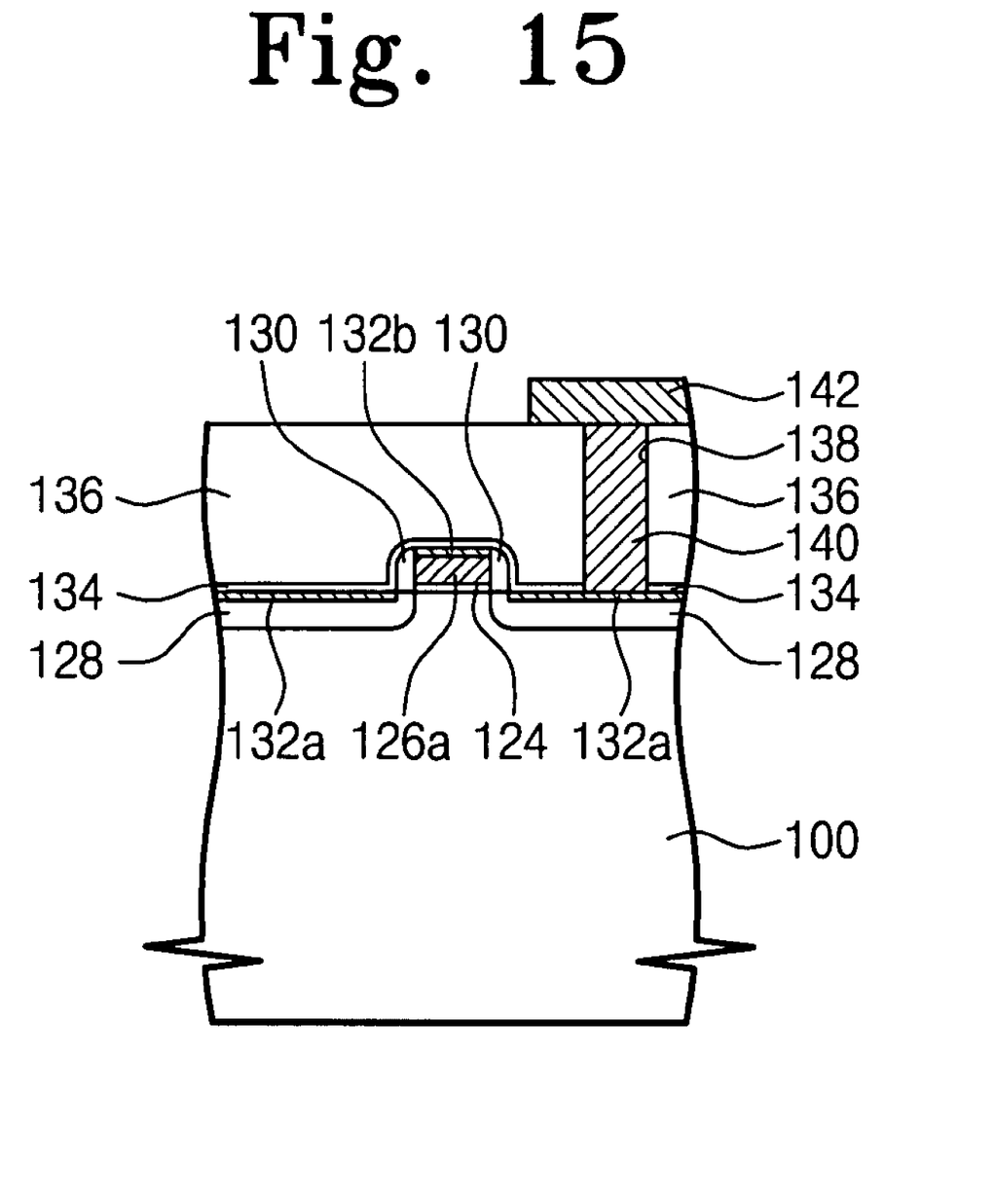
FIG. 15 illustrates the cross-sectional view along I-I' of FIG. 14.

Referring to FIG. 14 and FIG. 15, a trench 107a may be disposed at a desired, or alternatively, a predetermined region on the semiconductor substrate 100 to define an active region. A sidewall oxide layer 109 may be disposed on the sidewall and the bottom surface of the trench 107a. The filling insulation pattern 115a may fill the trench 107a. The top surface of the filling insulation pattern 115a may be at the same level as the top surface of the active region. A liner 111a may be interposed between the filling insulation pattern 115a and the sidewall and the bottom surface of the trench 107a. The liner 111a may be disposed at the sidewall oxide layer 109. The liner 111a may include an insulative material having an etch selectivity according to the filling insulation pattern 115a.

The capping insulation pattern 120a may cover the top surface of the filling insulation pattern 115a. The capping insulation pattern 120a may include an insulative material having an etch selectivity according to the filling insulation pattern 115a. The capping insulation pattern 120a may contact the liner 111a. The filling insulation pattern 115a may be surrounded by the capping insulation pattern 120a and the liner 111a. In other words, the filling insulation pattern 115a may fill the closed space surrounded by the capping insulation pattern 120a and the liner 111a. The center portion of the top surface of the capping insulation pattern 120a may be at the same or a higher level as the top surface of the active region.

The capping insulation pattern 120a may be extended sidewise to cover the edge of the active region. A relaxation insulation pattern 102a may be disposed between the sidewise extended portion of the capping insulation pattern 120a and the edge of the active region.

The top portion of the liner 111a interposed between the sidewall of the trench 107a and the filling insulation pattern 115a may be at a lower level than the edge of the top surface of the filling insulation pattern 115a. The capping insulation pattern 120a may be extended downward to contact the top portion of the liner 111a. The downward extended part of the capping insulation pattern 120a may cover the sidewall of the top portion of the filling insulation pattern 115a.

A gate electrode 126a may be formed over the top portion of the active region. A gate insulating layer 124 may be interposed between the gate electrode 126a and the active region. An impurity doped region 128 may be formed at the active region, which may be adjacent to both sides of the gate electrode 126a. The impurity doped region 128 may be formed by injecting impurity ions using the gate electrode 126a as a mask. The impurity doped region 128 may correspond to source and drain regions of an electric field effect transistor.

An insulating spacer 130 may be formed on both sidewalls of the gate electrode 126a. A first metal silicide 132a may be formed on the surface of the impurity doped region 128. The first metal silicide 132a may include nickel silicide, cobalt silicide, or titanium silicide. When the gate electrode 126a includes doped polysilicon, a second metal silicide 132b may be formed on the top portion of the gate electrode 126a. The second metal silicide 132b may include the same metal as that included in the first metal silicide 132a.

A method of forming the first and the second metal silicides 132a and 132b may include forming the insulating spacer 130, and then forming a metal layer on the semiconductor substrate 100 having an exposed top surface of the gate electrode 126a and an exposed top surface of the impurity doped region 128. Then a silicidation process may be performed to form the first and second metal silicides 132a and 132b. A non-reactive metal layer may be removed from the semiconductor substrate 100.

An etching eliminating layer 134 may cover the surface of the semiconductor substrate 100, and an interlayer insulating layer 136 may be disposed on the etch eliminating layer 134. The etch eliminating layer 134 may include an insulative material having an etch selectivity according to the interlayer insulating layer 136. For example, the interlayer insulating layer 136 may include oxide, and the etch eliminating layer 134 may include nitride or oxy-nitride.

A contact plug 140 may fill a contact hole 138 exposing the first metal silicide 132a through the interlayer insulating layer 136 and the etch eliminating layer 134, successively. A conductive part 142 in contact with the contact plug 140 may be disposed on the interlayer insulating layer 136. The conductive part 142 may be wire and may also be a storage electrode of a capacitor. When the conductive part 142 is a storage electrode, the conductive part 142 may be stack-shaped or cylinder-shaped.

According to the above described structure of a semiconductor device according to example embodiments, the filling insulation pattern 115a may be surrounded by the capping insulation pattern 120a and the liner 111a. The capping insulation pattern 120a and the liner 111a may include insulative material having an etch selectivity according to the filling insulation pattern 115a. Thus, the likelihood that the filling insulation pattern 115a may be etched by various types of cleaning processes may be reduced or prevented. As a result, a number of potential problems associated with the conventional method may be reduced or prevented.

As described above, after the filling insulation pattern is formed, the capping insulation pattern covering the top surface of the filling insulation pattern may be formed. Thus, the likelihood that the filling insulation pattern may be etched by cleaning processes performed before the gate insulating layer is formed and by cleaning processes performed after the gate electrode is formed may be reduced or prevented. In addition, the likelihood that various problems may occur due to the conventional dent or when the top surface of the filling oxide pattern is lower may be reduced or prevented.

The foregoing is illustrative of example embodiments and is not to be construed as limiting thereof. Although example embodiments have been described, those skilled in the art will readily appreciate that many modifications are possible in example embodiments without materially departing from the novel teachings and advantages of example embodiments. Accordingly, all such modifications are intended to be included within the scope of the claims. Therefore, it is to be understood that the foregoing is illustrative of example embodiments and is not to be construed as limited to the specific embodiments disclosed, and that modifications to the disclosed embodiments, as well as other embodiments, are intended to be included within the scope of the appended claims. Example embodiments are defined by the following claims, with equivalents of the claims to be included therein.

What is claimed is:

1. A method of forming a semiconductor device comprising:
   patterning a buffer insulation layer and a hard mask layer successively stacked on a substrate to form an opening exposing the substrate;
   etching the exposed substrate to form a trench defining an active region;
   forming a filling insulation layer on a surface of the substrate to fill the opening and the trench;
   planarizing the filling insulation layer until the patterned hard mask layer is exposed to form a filling insulation pattern to fill the trench;
   forming conformally a capping insulation layer having etch selectivity according to the filling insulation pattern on the surface of the substrate;
   forming a sacrificial insulation layer on the capping insulation layer, the sacrificial insulation layer filling the opening and having etch selectivity according to the capping insulating layer;
   planarizing the sacrificial insulation layer to form a sacrificial pattern on the capping insulation layer on the filling insulation pattern;
   etching the capping insulation layer and the patterned hard mask layer to expose a portion of the patterned buffer insulation layer and sidewall of the sacrificial insulation pattern leaving a capping insulation pattern below the sacrificial insulation pattern; and
   etching the patterned buffer insulation layer to expose the active region.

2. The method of claim 1 further comprising:
   performing at least one cleaning process to remove the sacrificial insulation pattern after exposing the active region.

3. The method of claim 1 further comprising, before forming the capping insulation layer:
   isotropically etching the patterned hard mask layer to make the width of the opening larger than the width of the top portion of the trench,
   wherein the capping insulation pattern covers an edge of the active region, and a portion of the patterned buffer insulation layer remains between the capping insulation pattern and the edge of the active region.

4. The method of claim 1 further comprising:
   forming a liner interposed between the filling insulation pattern and a sidewall and the bottom surface of the trench,
   wherein the liner includes an insulation material having etch selectivity according to the filling insulation pattern, the capping insulation pattern is in contact with an uppermost portion of the liner interposed between the filling insulation pattern and the sidewall of the trench, and the capping insulation pattern is surrounded by the capping insulation pattern and the liner.

5. The method of claim 4, wherein the uppermost portion of the liner is formed lower than an edge of the top surface of the filling insulation pattern, the capping insulation pattern is extended downward and contacts the uppermost portion of the liner.

6. The method of claim 4 further comprising, before forming the liner and filling insulation pattern:
   performing a thermal oxidation process at the substrate to form a sidewall oxide on the sidewall and the bottom surface of the trench.

7. The method of claim 1, further comprising:
   etching the planarized top surface of the filling insulation layer so that the planarized top surface of the filling insulation layer is lower than the top surface of the patterned hard mask layer to form the filling insulation pattern.

8. The method of claim 1, wherein the filling insulation layer is planarized using an abrasive-fixed CMP process, the abrasive-fixed CMP process being a CMP process using an abrasive-containing polishing pad and a particle-free chemical.

9. The method of claim 1, wherein the filling insulation layer includes a HARP (High Aspect Ratio Process) oxide.

10. The method of claim 1, wherein the sacrificial insulation layer is planarized by an abrasive-fixed chemical mechanical polishing (CMP) process, the abrasive-fixed CMP process being a CMP process using an abrasive-containing polishing pad and a particle-free chemical.

11. The method of claim 1, further comprising:
   forming a gate insulation layer on the exposed active region;
   forming a gate electrode on the gate insulation layer over the active region; and
   implanting impurity ions using the gate electrode as a mask to form an impurity-doped region at the active region.

* * * * *